United States Patent
Huels et al.

(10) Patent No.: US 8,358,511 B2
(45) Date of Patent: Jan. 22, 2013

(54) ELECTRONIC BOARD ARRANGEMENT AND ELECTRONIC INTERCONNECT BOARD OF AN ELECTRONIC BOARD ARRANGEMENT

(75) Inventors: Harald Huels, Horb am Neckar (DE); Dieter Staiger, Weil im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 1169 days.

(21) Appl. No.: 12/205,492

(22) Filed: Sep. 5, 2008

(65) Prior Publication Data
US 2009/0067146 A1   Mar. 12, 2009

(30) Foreign Application Priority Data
Sep. 6, 2007  (EP) .................................... 07115783

(51) Int. Cl.
*H01R 12/16* (2006.01)

(52) U.S. Cl. ........................ 361/788; 710/300

(58) Field of Classification Search .................. 361/788, 361/796–801; 710/300–305
See application file for complete search history.

(56) References Cited

U.S. PATENT DOCUMENTS

| | | | |
|---|---|---|---|
| 4,232,924 A * | 11/1980 | Kline et al. ...................... 439/74 |
| 5,269,693 A * | 12/1993 | Sekine ............................. 439/74 |
| 6,757,177 B2 * | 6/2004 | Harris et al. ................... 361/788 |
| 6,972,953 B1 * | 12/2005 | Heirich et al. ............ 361/679.46 |
| 7,161,810 B2 * | 1/2007 | Fraley et al. ................... 361/719 |
| 7,280,373 B2 * | 10/2007 | Aizawa ......................... 361/803 |
| 7,294,393 B2 * | 11/2007 | Murai et al. ............... 428/306.6 |

* cited by examiner

*Primary Examiner* — Tulsidas C Patel
*Assistant Examiner* — Travis Chambers
(74) *Attorney, Agent, or Firm* — Yee & Associates, P.C.; Mark E. McBurney

(57) ABSTRACT

The invention relates to an electronic-board arrangement, comprising at least two electronic boards, particularly integrated circuit boards, which are attached to a backplane which provides electrical interconnection between the at least two electronic boards. An electronic interconnect board providing electrical interconnect between the at least two electronic boards is arranged in a space in between the at least two electronic boards and the backplane.

20 Claims, 5 Drawing Sheets

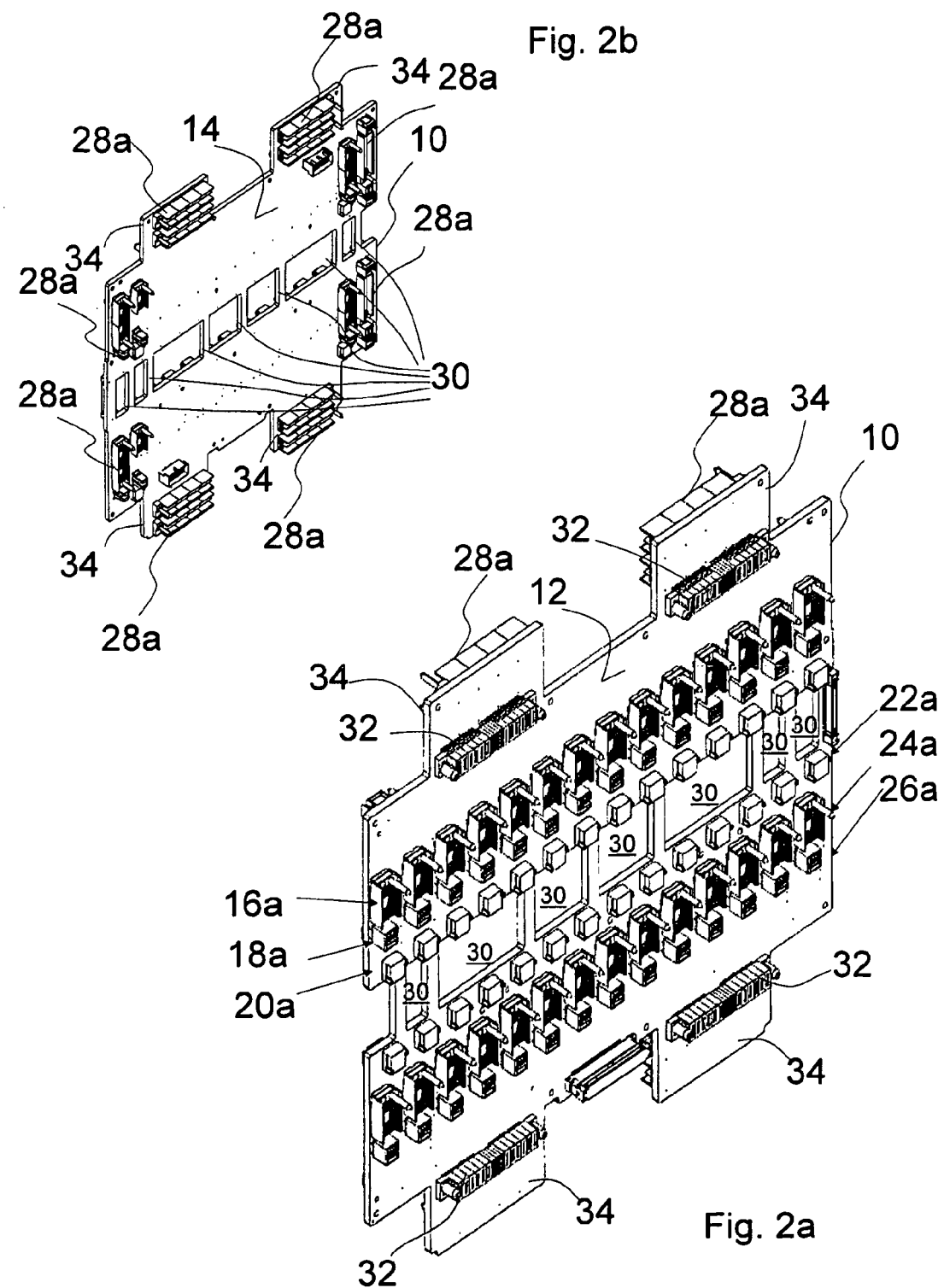

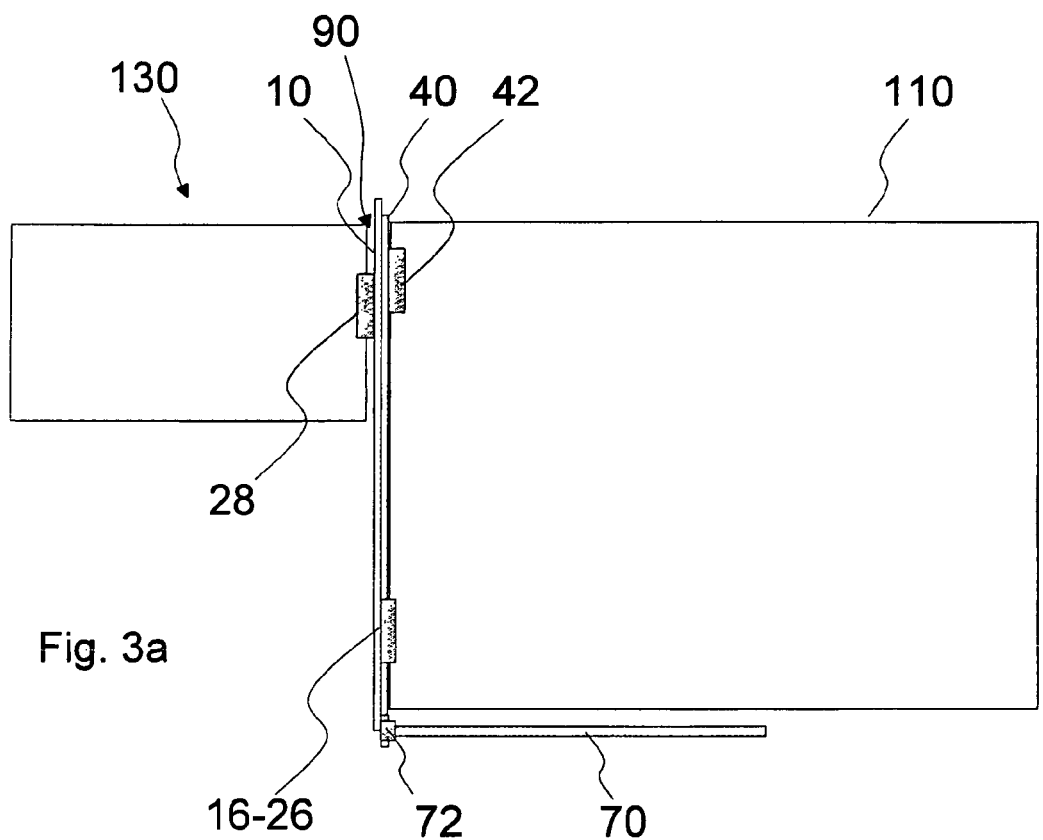
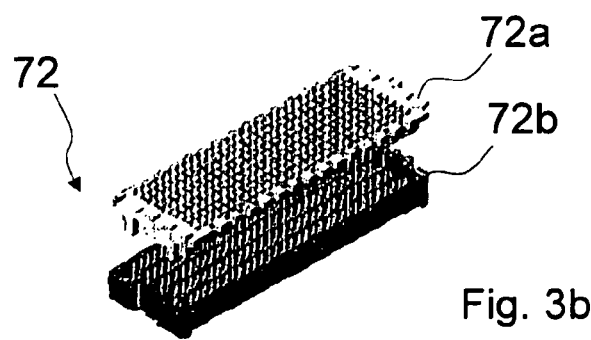

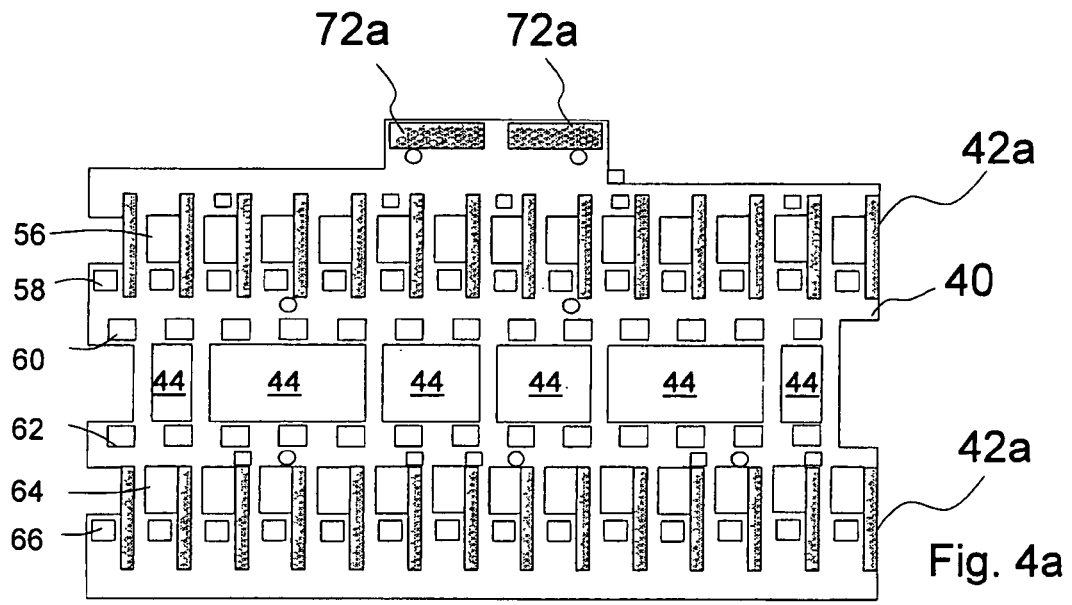
Fig. 4a
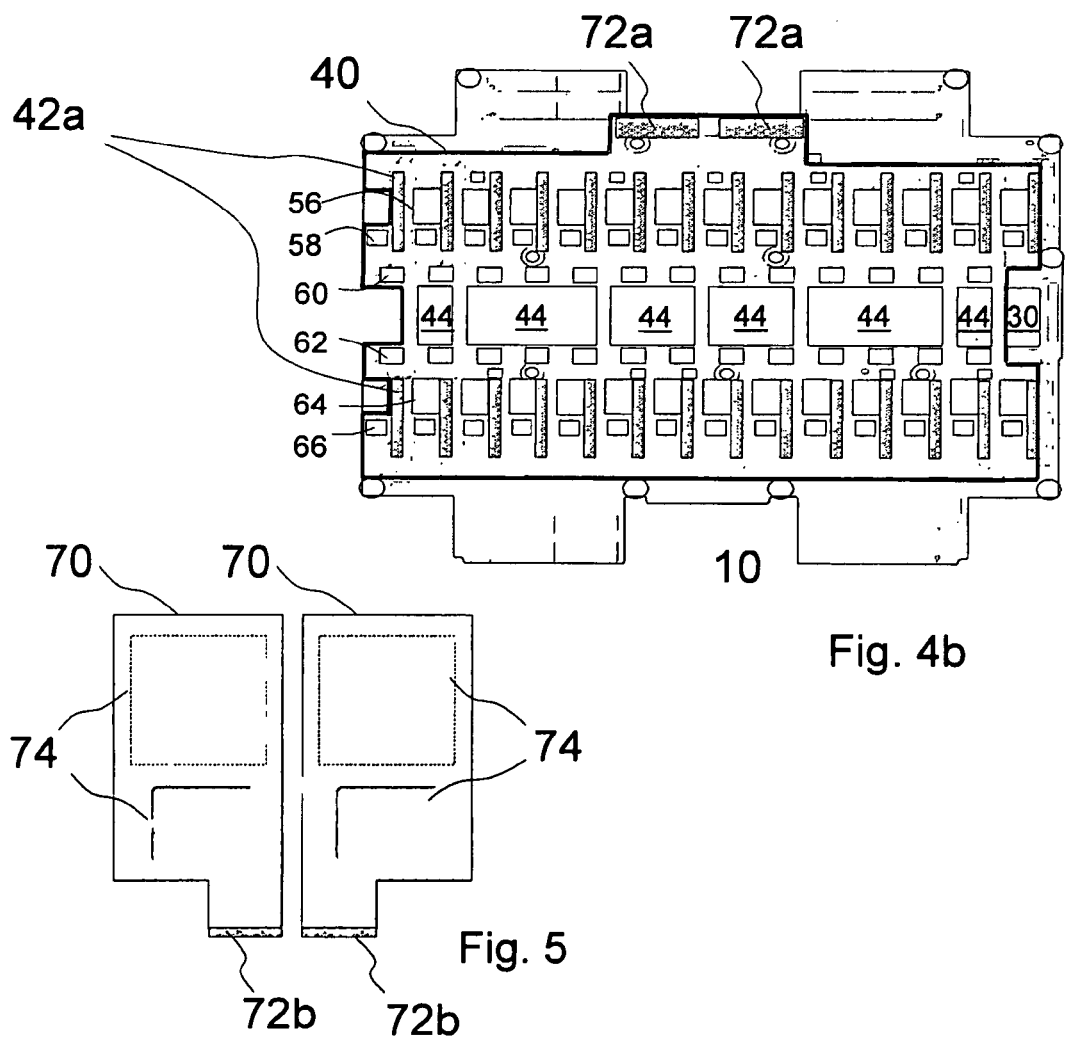
Fig. 4b
Fig. 5

ELECTRONIC BOARD ARRANGEMENT AND ELECTRONIC INTERCONNECT BOARD OF AN ELECTRONIC BOARD ARRANGEMENT

FIELD OF THE INVENTION

The invention relates to an electronic board arrangement and an electronic auxiliary board of an electronic board arrangement according to the preambles of the independent claims.

BACKGROUND OF THE INVENTION

In general, card-on-board electronic systems, such as so called Blade centers, are multi-server systems holding a plurality of servers. The servers can be dedicated individually to users or could be coupled building a higher performing SMP (SMP=Symmetric Multiprocessing System) server, or in High-Performance-Computing application could be linked by high-speed network thus building up a large scale server cluster.

A typical Blade cabinet is accommodating multiple 19-inch sized blade chassis. Each chassis itself can be populated with up to e.g. 14 single wide Blades. The expression "single wide" refers to a standard size of one unit in a standard chassis. Besides single wide Blades, double or multi wide Blades are also known which require the double and multiple width of a single wide unit, respectively. A Blade is an electronic board typically holding the entire core electronics required to represent a server. The Blades plugged into the Blade chassis can be of widely varying performance and I/O capability (I/O=Input/Output). Such Blades offer e.g. utilizing advanced server CPU's (CPU=Central Processing Unit), or multi-core CPU's, or advanced processors of various manufacturers. The standardized connectors of the Blades enable to populate a Blade Center (BC) to customer requirements in any mix of different Blade types.

As described, a typical BC chassis can be populated with up to 14 single wide Blades. For this reason, each chassis is provided a backplane planar board in the size accommodating the connectors to support 14 Blade positions. The backplane is oriented perpendicular to the front face of the Blades. Depending on the provider, this backplane planar board can feature the connectors for the Blades on the front side. In addition, it is possible to provide connectors on the rear side allowing plugging in various switch/network modules from the rear. Such a backplane is called the BC 'midplane'.

The BC midplane printed circuit wiring is connecting the inputs and outputs (I/O) of each Blade position to the connectors of the mentioned various network and switch modules. In addition, the midplane is interconnecting wiring each Blade to the BC Management Modules, and, last not least, is providing DC power for each pluggable front and rear module.

Standardized systems are a precondition for allowing to build-up the described customer specific BC multi-server systems choosing form a wide variety of modules—but, on the downside, standard systems are restricted to the connectivity provided by the standardized interfaces.

New system designs, requiring by the present standard revision not foreseen connectivity or functions, most likely are forced to develop new complex sumptuous connectivity solutions, typically going along with significant cost adders for the final product. The new requirements can influence a new standard definition in progress, however, new standard releases are typically dismissed in longer time interval. However, a new system design usually cannot tolerate such a time delay.

Prevalently, new system designs require new/additional bus-connectivity utilizing high-speed links to the network modules, or even more urgent, require specific high-speed links to 'neighborhood' Blade positions. Typical solutions for example are cable assembly connections, which are either bulky and physically difficult to fit or suffer from lossy signal propagation and signal integrity problems.

SUMMARY OF THE INVENTION

It is an object of the invention to provide an electronic-board arrangement providing additional bus-connectivity between electronic boards plugged on a backplane without altering the basic structures and layouts of the electronic boards as well as an appropriate interconnect unit.

These objects are achieved by the features of the independent claims. The other claims and the specification disclose advantageous embodiments of the invention.

An electronic card-on-board arrangement is proposed, comprising at least two electronic boards, particularly integrated circuit boards, more particularly boards with each board representing a server, which are plugged onto a backplane providing electrical interconnection between the at least two electronic boards, wherein an electronic interconnect board providing electrical interconnect between the at least two electronic boards is arranged in a space in between the at least two electronic boards and the backplane.

The preferred arrangement described allows for extending the connectivity provided by the respective backplane of card-on-board based electronic systems. The electronic interconnect board is entirely independent from the basic given system design. The given standard system components, e.g. electronic boards and backplane to which the boards are attached, are kept unchanged. The electronic interconnect board needs only to be positioned by e.g. some mechanical 'fixing guides'. The electronic interconnect board can be understood as a 'planar-overlay' to the standard backplane or midplane board.

The electronic interconnect board makes use of unused free space in the arrangement without a need to change the layout, hardware or software, of the other standard boards. Advantageously, new and additional links to network side modules do not need to pass the standardization process delaying the availability of new technology. Another advantage is that although IC-board position interconnections, particularly Blade to Blade position interconnections, are typically extremely application specific and, therefore, not a likely subject for a standardization, these problems can be circumvented by the invention. Interconnections between IC boards can be provided without changing the basic structures and layouts.

For application specific solutions typically expensive cable-assemblies are used to interconnect the respective IC boards, such as Blades, e.g. for Blade position spanning SMP expansion (SMP=Symmetric Multiprocessing System), typically specific Blades interconnecting in a mother/daughter card concept are designed. Both mentioned solutions in common need specific Blade designs, with complex and expensive mechanical solutions plugged into a BC as a big bulky 'pre-assembled' unit. Advantageously, by employing the invention, expensive new-designs for each custom system can be avoided as well as signal integrity problems, signal degradation over long transmission cables.

Advantageously, the electronic interconnect board can provide cut-outs in its body for electrical connectors connecting the at least two electronic boards and the backplane. The cut-outs facilitate the positioning of the interconnect board without changing the conventional position of the at least two electronic boards on the backplane. Favorably, if the electronic interconnect board overlaps the backplane, the interconnect board can provide cut-outs for a cooling medium overlapping with cut-outs for a cooling medium in the backplane. This avoids a redesign of the cooling paths in the arrangement and provides convenient cooling of the at least two electronic boards as well as of the interconnect board.

In an appropriate development the electronic interconnect board can provide electrical interconnects, particularly high-speed interconnects, between the at least two electronic boards. Particularly, the electronic interconnect board can provide electrical connectors for at least one of the at least two electronic boards. Preferably, the interconnect board provides connectors for all boards plugged onto the backplane, e.g. a midplane-type backplane. The backplane can be, but not necessarily needs to be, mounted in a chassis, particularly in a standard 19-inch chassis.

Advantageously, the electronic interconnect board can be electrically insulated at least against the backplane. Particularly, the interconnect board can be electrically floating with respect to the backplane and the at least two electronic boards. The interconnect board can be mounted in the chassis which contains the other boards without being mechanically attached with fixing means to the backplane. The interconnect board can be fixed to the chassis by usual fixing means. The electronic interconnect board can be mechanically self supporting with respect to the backplane as well as to the at least two electronic boards.

In an advantageous embodiment, the interconnect board can provide electrical connectors for mechanically self-adjustment with respect to the at least two electronic boards and/or the backplane. The electrical connectors are used for plugging the at least two electronic boards onto the interconnect board.

The electronic interconnect board can comprises a flexible board material, particularly consist of a flexible material, and/or can comprise a rigid board material, particularly consist of a rigid material. The flexible material allows for a better use of restricted empty space between the boards, whereas the rigid material can provide a better stability. The interconnect board can be very thin, e.g. a few millimeters, preferably 1-4 mm, preferably about 3 mm. If the arrangement is less restricted in space consumption, the interconnect board can be thicker, preferably about 10 mm, particularly about 13 mm. In the latter case, discrete electronic components can be mounted on the interconnect board.

The electronic interconnect board can be oriented in parallel to the backplane and perpendicular to the main flat side of at least two electronic boards. The at least two electronic boards can be plugged onto the backplane as usual with the interconnect board placed between the backplane and the at least two boards. By this geometrical arrangement free space can be used virtually without influencing the standard components of the board arrangement.

According to a further advantageous embodiment, the electronic interconnect board can provide at least one or more electrical connectors for at least one additional interconnect-extension board which extends the capability of the interconnect board.

Preferably, the at least one additional electronic interconnect-extension board is oriented perpendicular to the electronic interconnect board and the backplane providing an improved space utilization in the preferred arrangement.

The additional interconnect-extension board can provide electronic circuitry for extending functionality of the at least two electronic boards.

According to another aspect of the invention, an electronic interconnect board is proposed for an arrangement comprising at least two electronic boards and a backplane, wherein the board is providing cut-outs overlapping in a mounted state with cut-outs in and protruding elements on the backplane and one or more electrical connectors between the at least two electronic boards and the backplane. Preferably, the board is made of high-speed board material.

Particularly, low loss high speed board material can be applied. Low loss material like for example the polymer material PTFE (polytetrafluoroethylene) can reduce total signal propagation delay and provide an appropriate baseline for good signal integrity.

The interconnect board can also provide electrical connectors for electrically connecting the at least two electronic boards to the board and the electrical interconnects provided therein. The interconnect board can comprise of a flexible body and/or a rigid body. Particularly, the interconnect board can comprise flexible and rigid body parts for a better adaptation to the backplane.

One or more connectors can be provided for electrically attaching an additional electronic interconnect-extension board oriented perpendicular to the interconnect board body.

Additionally, an interconnect arrangement of at least a first interconnect board and at least a second interconnect-extension board is proposed being adapted to fit in free space between and/or around an assembly of one or more electronic boards plugged onto a backplane.

The proposed arrangement represents a flexible high-speed multi card-to-card intercommunication for card-on-board systems not requiring to new-design the system standard card-on board backplane or midplane board. The system specific standard design points are not changed by adding-on the new interconnect arrangement. The proposed interconnect board with or without one or more additional interconnect-extension boards is providing add-on functionality while keeping all Blade Center specified characteristics and can even be implemented as add-on feature to existing backplane/midplane board designs in the aftermarket.

The invention allows for a cost-effective and reliable high-performance card intercommunication solution for card-on-board systems. Critical cabling and expensive product solutions supporting higher computing performance by SMP or e.g. Cell Blade coupling or individual card designs, e.g. for mother and daughter Blades, known in today's solutions in the art can be avoided. Particularly, individual card designs can be reduced to interconnect-board-linked board designs.

The interconnect board allows for more connectivity areas on the interconnect board and can foresee interconnect board space allowing to populate active electronic components on the interconnect board. This can improve the positive attributes of the invention even more.

BRIEF DESCRIPTION OF THE DRAWINGS

The present invention together with the above-mentioned and other objects and advantages may best be understood from the following detailed description of the embodiments, but not restricted to the embodiments, wherein is shown in:

FIG. 2a a front-side view of a conventional card-on-board midplane-type backplane;

FIG. 2b a rear-side view of the card-on-board midplane-type backplane depicted in FIG. 2a;

FIG. 3a a side view of a preferred embodiment of an arrangement of an electronic interconnect board and an additional interconnect-extension board in a Blade-midplane assembly according to the invention;

FIG. 3b a preferred high speed connector for attaching an additional interconnect-extension board to the electronic interconnect board;

FIG. 4a a front view of a preferred embodiment of a, electronic interconnect board;

FIG. 4b the interconnect board of FIG. 4a overlaying a midplane-type backplane;

FIG. 5 optional additional interconnect-extension boards; and

DETAILED DESCRIPTION OF EXAMPLE EMBODIMENTS

Figure 1:
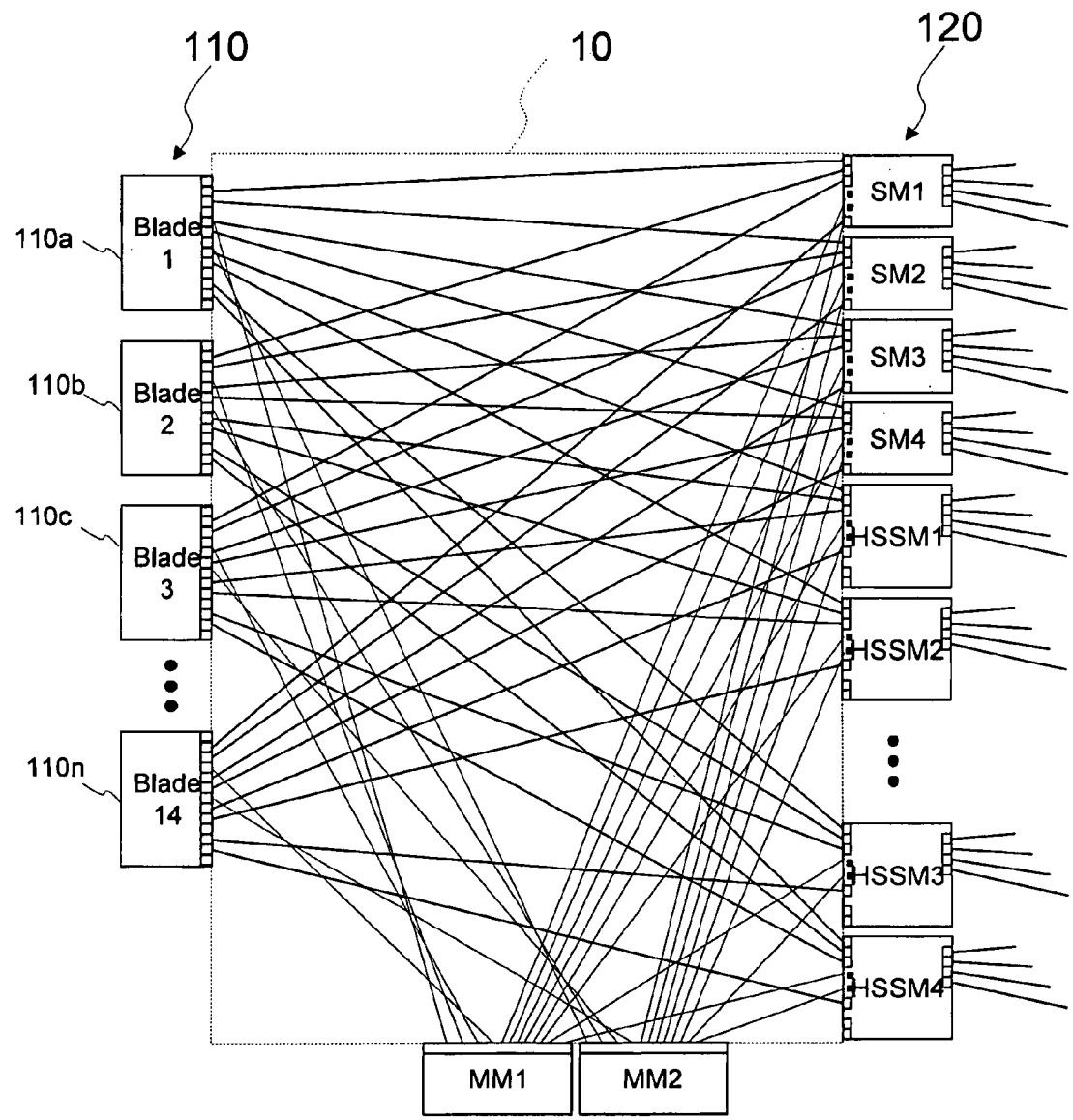
FIG. 1 a prior art multi-server Blade Center block diagram featuring a midplane-type backplane.

The drawings are merely schematic representations, not intended to portray specific parameters of the invention, The drawings are intended to depict only typical embodiments of the invention and therefore should not be considered as limiting the scope of the invention. In the drawings, like elements are referred to with equal reference numerals.

FIG. 1 depicts a prior art multi-server Blade Center block diagram wherein integrated circuit boards 110 comprising individual Blades 110a-110n are plugged onto a midplane-type backplane 10. The backplane 10 provides connectors (not explicitly referred to with reference numerals) and wiring which connects the Blades 110a-110n to e.g. one or more management modules 130 and switch modules 120. The various lines in the midplane between the Blades 110a-110n and the switches 120 and the management modules 130 indicate the possible connections provided by the midplane-type backplane 10.

FIGS. 2a and 2b show a front-side and a rear-side view of a midplane-type backplane 10. Such a conventional backplane 10 can be used in the preferred board arrangement according to the invention shown in FIG. 3a without altering the design of the backplane 10.

Cut-outs 30 in the middle of the midplane-type backplane 10 provides an air-pass for cooling of the electric components in the mounted state with the backplane 10 e.g. mounted in a Blade chassis (not shown). On the front side 12 various connector parts 16a-26a are provided (for clarity only a few of these are marked with reference numerals). The connector parts 16a-26a protrude perpendicular to the board plane and are arranged column-like in 14 columns so that 14 single wide Blades (electronic boards 40, not shown) can be plugged in parallel to each other with connector parts mating the board-side connector parts 16a-26a. The connector parts 16a-26a provide connections to i.e. power supplies, management modules 130 (FIG. 1), midplane rear plug-in modules and the like. Four small plates 34 protruding in the plane of the backplane 10 at its upper and lower edge support power-supply connector parts 32 on the front side 12 and connector parts 28a on the rear side 14. The connector parts 28a on the rear side 14 of the midplane-type backplane 10 provide connections to i.e. power supplies, management modules 130 (FIG. 1), network plug-in modules and the like.

Depicted in FIG. 3a is a side view of a preferred embodiment of an arrangement of an electronic interconnect board 40 and an additional interconnect-extension board 70 in a Blade-midplane assembly according to the invention, where one or more Blades are the electronic boards 110 plugged onto a midplane-type backplane 10. The interconnect board 40 is arranged in a free space 90 in between the front face of the Blade (electronic board 110) and the midplane-type backplane 10, parallel to the main surface of the backplane 10 in an overlay-manner.

The Blade (electronic board 110) is connected to the midplane-type backplane 10 via a connector 16 which penetrates the interconnect board 40 in an appropriate cut-out in the interconnect-board body. The connector 16 can be e.g. a standard Blade-midplane connector. The interconnect board 40 surrounds such connectors 16 and allows a stable connection of the mating connector parts. A management module 130 is plugged onto a connector 28 at the rear side of the midplane-type backplane 10.

The Blade (electronic board 110) is electrically connected to the interconnect board 40 via a connector 42. The interconnect board 40 is parallel to the midplane-type backplane 10 and to the Blade (electronic board 110) front face. Attached to the interconnect board 40 is the additional interconnect-extension board 70 via a connector 72 which can be a high-speed connection like the one depicted in FIG. 3b, wherein on connector part 72a is mounted on the interconnect board 40 and the mating connector part 72b is mounted on the additional interconnect-extension board 70. The interconnect-extension board 70 can comprise passive and active components as well as one or more electrical interconnects which can be directly electrical interconnects, capacitive interconnects and/or optical interconnects, thus favorably enabling the interconnect-extension board 70 to provide additional electrical connectivity to preferably external links, such as network links and/or proprietary links to other Blades and the like.

It should be mentioned that the connector 72 which connects the interconnect-extension board 70 to the interconnect board 40 can also be used for external links. Instead of attaching the interconnect-extension board 70 a connection means such as a cable to external devices can be attached to the connector 72. Connector 72 can provide connection preferably by direct electrical, optical and/or capacitive coupling.

Both boards 10, 40 can appropriately feature an electrically isolating coating on eventually touching surfaces, or can be separated by e.g. a thin isolation foil. There is no electrical connection to the midplane-type backplane 10—nor needs the interconnect board 40 be mechanically fixed or attached to the midplane-type backplane 10. The interconnect board 40 represents a floating-interconnect planar (FIP card) overlaying the midplane-type backplane 10.

As shown in FIG. 3a, the basic interconnect board 40 is positioned in between the midplane-type backplane 10 and the Blades 110 plugged onto the midplane-type backplane 10. In case the respective given system design provides 'unused' space 90, the extended additional interconnect-extension board 70 (FIP-Feature card) can be added thus connecting to the interconnect board 40 as illustrated perpendicular to the backplane 10.

Even though modern Blade Centers (BC) are designed highly utilizing space and hardware real-estate—a mindful examination of the chassis can reveal space to receive one or more additional interconnect-extension boards 70.

Favorably, the interconnect board 40 fits into the existing system design and does not require any changes to the existing hardware nor generates demand for software changes. Therefore, as depicted in FIGS. 4a and 4b, the interconnect board 40 is designed to provide board cut-outs 56-66 (for clarity only a few are marked with reference numerals) allowing the interconnect board 40 to fit over the midplane-type backplane 10 and allowing the standard midplane-Blade connectors 16 (FIG. 3a) to ensure fully engaged mail/female parts 16a-26a (FIG. 2b) of the connectors guaranteeing prior design electrical connectivity. Even so, cut-outs 44 are ensuring unchanged air-pass gaps which overlap with respective cut-outs 30 of the midplane-type backplane 10, as shown in FIG. 4b.

The interconnect board 40 itself provides connectors 42a and/or additional interconnects positioned at unused areas on the front side. These connectors 42a are used to connect to the application specific Blade signals. The connectors including connectors 42a and/or 72 provided by the interconnect board 40 can be direct electrical, capacitive and/or optical connectors. The interconnect board 40—a floating board overlay to the midplane-type backplane 10—is 'physically self adjusted' by the mechanical connectors 42a and guide pins, electrically providing the design specific desired additional links to the respective Blades (electronic board 110). The overlap of the interconnect board 40 and the midplane-type backplane 10 is depicted in FIG. 4b with the backplane 10 in the background.

As the typical application for the interconnect board 40 is high speed linking among the Blades (electronic board 110), it is recommended to use high speed board material, such as PTFE-based insulation layers allowing to build up a FIP board cross-section with a minimum signal propagation delay and signal losses while providing best provision for good signal integrity.

The interconnect board 40 can have a board thickness of up to 3 mm. If a modification of the Blade bottom and cover sheet-metal can be tolerated, the space in between the midplane-type backplane 10 and the Blade (electronic board 110) card edge can be increased to as much as 13 mm, thus allowing even more thickness for the interconnect board 40 and enabling to place space demanding active components directly on the interconnect board 40.

As already mentioned, the interconnect board 40 allows to be extended by one or more additional interconnect-extension boards 70. This advantageous option positions the interconnect board 40 as an extended platform allowing accommodating new, e.g. customer specific, expansion module slots. Appropriately, the extend of applicability of this interconnect-board potential is restricted by the 'given design' of the overall system.

For example, two connectors 72a are enabling to populate application dedicated additional interconnect-extension boards 70 in a 180° population orientation to the standard backplane 10, and electronic boards 110—fitting into 'hidden' space provided by the Blade Center power-supply housing molding. By way of example, FIG. 5 depicts the two additional interconnect-extension boards 70 comprising board electronics 74, e.g. high-speed configurable switch FPGA (FPGA=Field Programmable Gate Array), implemented on the interconnect-extension boards 70 and connector parts 72b for connecting to the connector parts 72a of the interconnect board 40. In other systems, the shape and number of additional interconnect-extension boards 70 can be different, depending on the actual system and depending on the space available.

Figure 6:
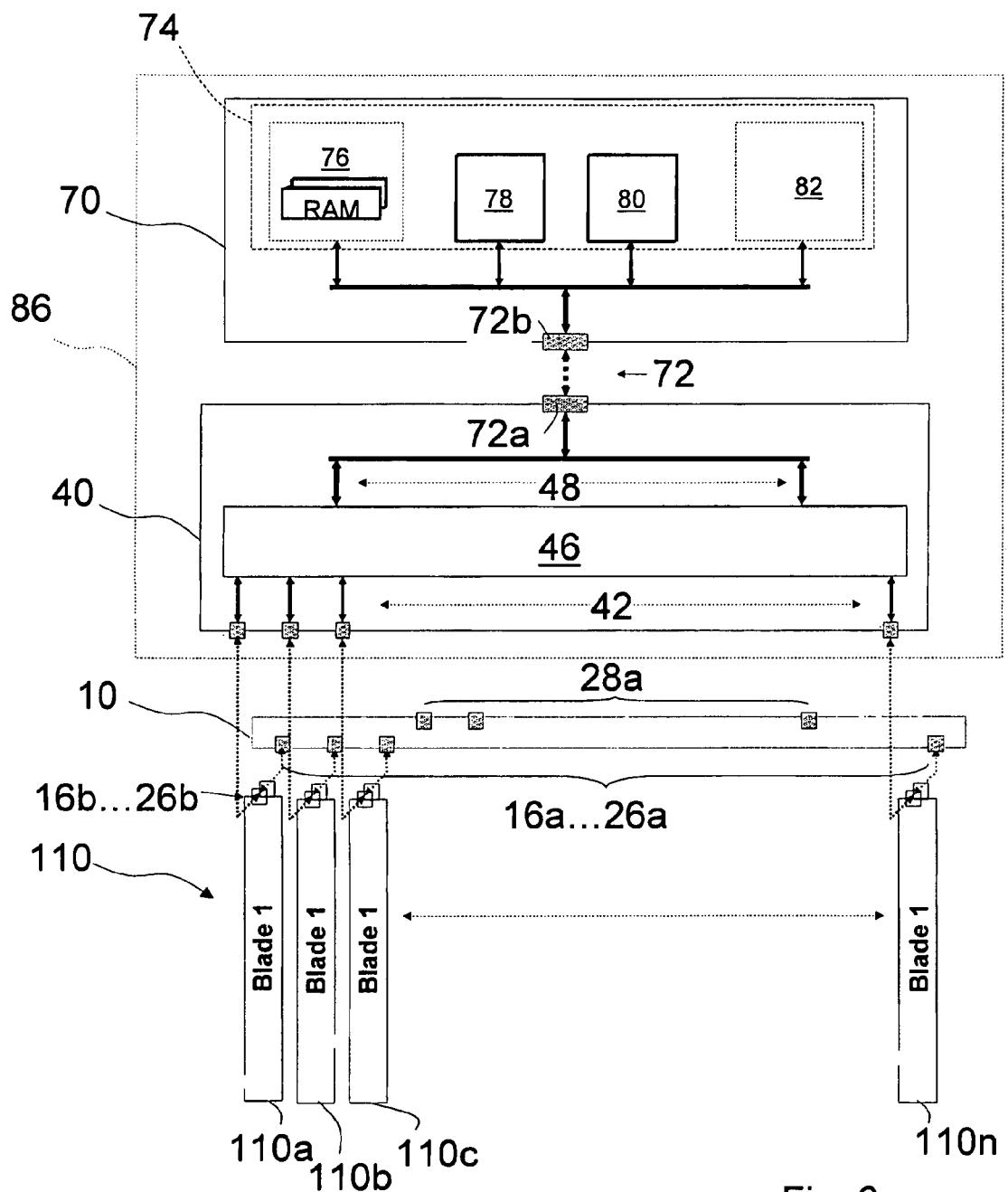
FIG. 6 a block diagram of a preferred interconnect board platform according to the invention.

FIG. 6 illustrates an extended interconnect-arrangement solution—in this example implementing an 'Inter-Blade Switch Module' performing communication acceleration and pre-/post-processing data streams exchanged among the respective Blades (electronic boards 110). The solution can comprise a platform 86 with an interconnect board 40 and one or more additional interconnect-extension boards 70.

The Blades (electronic boards 110) are plugged into the BC chassis connecting to the midplane-type backplane 10 via mating connector parts 16a-26a, 16b-26b. In addition, Blades (electronic boards 110) extended with an interconnect board 40 connect via additional connectors 42. The interconnect board 40 is providing the application unique Blade position interconnection wiring 46 as well as passive and active electronic components eventually directly placed on the interconnect board 40 and eventual bus wiring 48 for connection to the additional interconnect-extension board or boards 70 (if board or boards 70 are provided). As well application driven, the interconnect board 40 may hold in addition active or passive components like e.g. FET switches, signal drivers, signal conditioning, etc. (not shown).

The additional interconnect-extension board 70 is a plug-in module connecting via high bandwidth connection 72 to the interconnect board 40. The example module depicts some typical electronic component groups 76, 78, 80, 82 for an 'Inter-Blade Switch Module' extending the standard BC/Blade capabilities. A data queue memory 76 e.g. can be implemented to synchronize and buffer high-speed data streams. Utilizing advanced components as e.g. provided by C-Switch® 78, a programmable device (FPGA) featuring e.g. 2 GHz data processing capability, can allow to 'examine' data packets and perform real-time filtering and switching of inter-communication data streams. A network processing specialized off-load engine (CPU) 80 attached to the FPGA/interconnect-extension-board bus can effectively perform desired data manipulation operations it could also utilize an optical link to other Blade Centers. Reference numeral 82 refers to probable discrete electronic components in the additional interconnect-extension board 70.

Adding unique network processing in between the communicating Blades (electronic boards 110) is increasing the overall system communication and processing performance thus providing functionality significantly extending the present BC capabilities.

Favorably, a raw interconnect-board design can be provided enabling customers to develop their own Blade or board intercommunication on specific requirements. Preferably, a board kit of an arrangement 86 of one or more interconnect/interconnect-extension boards 40, 70 can be provided. The board kit can include multiple pre-designed specific cross section examples for interconnect boards 40 and interconnect-extension boards 70 utilizing a qualified high-speed board material of an original equipment manufacturer. The kit can further include the general board layout including basic wirings and interconnect board/Standard card connectors 42 (e.g. Blades) as well including potential additional interconnect board connectors 72.

The invention claimed is:

1. An electronic-board arrangement, comprising at least two electronic boards which are plugged onto a backplane that provides electrical interconnection of both power and data signals between the at least two electronic boards, characterized in that an electronic interconnect board provides an independent additional electrical interconnect between the at least two electronic boards and is arranged in a space in between the at least two electronic boards and the backplane.

2. The arrangement according to claim 1, characterized in that the electronic interconnect board provides first cut-outs for electrical connectors connecting the at least two electronic boards and the backplane, and second cut-outs overlapping with third cut-outs provided by the backplane for a cooling medium provided to the backplane.

3. The arrangement according to claim 1, characterized in that the electronic interconnect board is electrically insulated at least against the backplane, wherein the at least two electronic boards are plugged onto a front side of the backplane, and a management module is plugged onto a rear connector mounted on a rear side of the backplane.

4. The arrangement according to claim 1, characterized in that the electronic interconnect board is mechanically self supporting with respect to the backplane.

5. The arrangement according to claim 1, characterized in that the electronic interconnect board provides electronic board electrical connectors contacting the at least two electronic boards, wherein the electronic board electrical connectors provide a mechanical self-adjustment with respect to the at least two electronic boards.

6. The arrangement according to claim 1, characterized in that the electronic interconnect board comprises a flexible board material.

7. The arrangement according to claim 1, characterized in that the backplane provides a plurality of electronic board electrical connectors contacting the at least two electronic boards.

8. The arrangement according to claim 1, characterized in that the electronic interconnect board is oriented in parallel to the backplane and includes active electronic circuitry.

9. The arrangement according to claim 1, characterized in that the electronic interconnect board provides at least one interconnect-extension board electrical connector, and further comprising an electronic interconnect-extension board that is plugged onto the at least one interconnect-extension board electrical connector and provides electrical connectivity for external communication links, the electrical connectivity comprising at least one direct connector for direct electrical and/or optical and/or capacitive coupling.

10. The arrangement according to claim 9, characterized in that the at least one electronic interconnect-extension board is oriented perpendicular to the electronic interconnect board.

11. The arrangement according to claim 9, characterized in that the at least one electronic interconnect-extension board provides electronic circuitry that extends functionality provided by the at least two electronic boards.

12. The arrangement according to claim 9, wherein the at least two electronic boards are plugged onto a front side of the backplane, and a management module is plugged onto a rear connector mounted on a rear side of the backplane.

13. An electronic interconnect board for an arrangement comprising at least two electronic boards plugged onto a backplane that provides electrical interconnection of both power and data signals between the at least two electronic boards, characterized in providing cut-outs in the electronic interconnect board that overlap in a mounted state with (i) backplane cut-outs in the backplane, (ii) protruding elements on the backplane and (iii) at least one electrical connector between the at least two electronic boards and the backplane.

14. The electronic interconnect board according to claim 13, characterized in that the electronic interconnect board comprises a body of high-speed board material.

15. The electronic interconnect board according to claim 13, characterized in that the electronic interconnect board provides electrical interconnects between the at least two electronic boards and the backplane provides a plurality of electronic board electrical connectors contacting the at least two electronic boards.

16. The electronic interconnect board according to claim 13, characterized in that electronic board electrical connectors are provided for electrically connecting the at least two electronic boards to the electronic interconnect board and the backplane provides a plurality of additional electronic board electrical connectors contacting the at least two electronic boards.

17. The electronic interconnect board according to claim 13, characterized in that the electronic interconnect board comprises a flexible body.

18. The electronic interconnect board according to claim 13, characterized in that the electronic interconnect board comprises a rigid body.

19. An electronic interconnect board for an arrangement comprising at least two electronic boards plugged onto a backplane, characterized in providing cut-outs in the electronic interconnect board that overlap in a mounted state with (i) backplane cut-outs in the backplane, (ii) protruding elements on the backplane and (iii) at least one electrical connector between the at least two electronic boards and the backplane, characterized in that at least one interconnect-extension board connector is provided for electrically attaching at least one electronic interconnect-extension board oriented perpendicular to the electronic interconnect board.

20. An arrangement of at least a first electronic interconnect board and at least one second electronic interconnect-extension board, the arrangement being adapted to fit in free space between at least two electronic boards plugged onto a backplane that provides an electrical interconnect between the at least two electronic boards, characterized in that the first electronic interconnect board provides an independent additional electrical interconnect between the at least two electronic boards.

* * * * *